United States Patent [19]

Miller et al.

[11] Patent Number: 5,536,672
[45] Date of Patent: Jul. 16, 1996

[54] FABRICATION OF FERROELECTRIC CAPACITOR AND MEMORY CELL

[75] Inventors: William D. Miller, Rio Rancho; Joseph T. Evans; Wayne I. Kinney, both of Albuquerque; William H. Shepherd, Corrales, all of N.M.

[73] Assignee: National Semiconductor Corporation, Santa Clara, Calif.

[21] Appl. No.: 950,795

[22] Filed: Sep. 24, 1992

Related U.S. Application Data

[60] Continuation of Ser. No. 716,061, Jun. 17, 1991, abandoned, which is a division of Ser. No. 105,578, Oct. 8, 1987, Pat. No. 5,046,043.

[51] Int. Cl.$^6$ ................................................. H01L 21/70
[52] U.S. Cl. ................ 437/52; 437/60; 437/919
[58] Field of Search .......................... 437/52, 60, 919; 257/295; 365/145

[56] References Cited

U.S. PATENT DOCUMENTS

| | | | |
|---|---|---|---|
| 3,305,394 | 2/1967 | Kaiser et al. | 117/217 |
| 3,681,765 | 8/1972 | Chapman | 340/173.2 |
| 3,691,535 | 9/1972 | Williams | 340/173 PP |
| 3,798,619 | 3/1974 | Samofalov et al. | 340/173.2 |
| 3,832,700 | 8/1974 | Wu et al. | 340/173.2 |
| 3,969,197 | 7/1976 | Tolar et al. | |
| 4,144,591 | 3/1979 | Brody | 365/228 |
| 4,161,038 | 7/1979 | Wu | 365/145 |
| 4,162,402 | 7/1979 | Hopper | 250/332 |
| 4,164,751 | 8/1979 | Tasch, Jr. | 357/41 |
| 4,195,355 | 3/1980 | Rohrer | 365/145 |
| 4,250,206 | 2/1981 | Bate et al. | 437/52 |
| 4,324,750 | 4/1982 | Maher | 264/61 |
| 4,437,139 | 3/1984 | Howard | 437/978 |
| 4,471,405 | 9/1984 | Howard et al. | 361/305 |
| 4,477,401 | 10/1984 | Hagemann et al. | 264/61 |
| 4,536,785 | 8/1985 | Gibbons | 357/54 |
| 4,649,406 | 3/1987 | Takemae et al. | 357/23.6 |
| 4,674,176 | 6/1987 | Tuckerman | 29/591 |
| 4,713,157 | 12/1987 | McMillan et al. | 204/192.11 |
| 4,728,623 | 3/1988 | Lu et al. | 437/52 |
| 4,782,380 | 11/1988 | Shankar et al. | 357/71 |
| 4,794,563 | 12/1988 | Maeda | 437/60 |
| 4,810,673 | 3/1989 | Freeman | . |
| 4,860,254 | 8/1989 | Pott et al. | 365/145 |
| 4,873,455 | 10/1989 | de Chambost et al. | 307/201 |
| 4,891,684 | 2/1990 | Nishioka et al. | 437/919 |
| 4,939,104 | 7/1990 | Pollack et al. | 437/52 |
| 4,946,710 | 8/1990 | Miller et al. | 427/240 |
| 5,038,323 | 8/1991 | Schwee | 365/145 |
| 5,046,043 | 9/1991 | Miller et al. | 365/145 |
| 5,148,861 | 9/1992 | Turner | 437/52 |

FOREIGN PATENT DOCUMENTS

| | | | |
|---|---|---|---|
| 1207932 | 8/1989 | Japan | 148/DIG. 43 |
| 1544314 | 4/1979 | United Kingdom | . |
| 8604447 | 7/1986 | WIPO | . |

OTHER PUBLICATIONS

Arnett, "Ferroelectric FET Device", *IBM Technical Disclosure Bulletin*, Vol. 15, No. 9, Feb. 1973, p. 2825.

Sullivan, "Hybrid Volatile/Nonvolatile Integrated Memory Arrays", *IBM Technical Disclosure Bulletin*, Vol. 18, No.5, Oct. 1975, p. 1540–1541.

*Primary Examiner*—George Fourson
*Assistant Examiner*—S. Mulpuri
*Attorney, Agent, or Firm*—Richards, Medlock & Andrews

[57] ABSTRACT

A ferroelectric capacitor structure is designed for fabrication together with MOS devices on a semiconductor substrate. The ferroelectric capacitor includes a diffusion barrier above the surface of the substrate for preventing the materials of the ferroelectric capacitor from contaminating the substrate or MOS devices. The ferroelectric capacitor comprises a bottom electrode, a thin film ferroelectric layer and a top electrode. An interlayer dielectric is formed to cover portions of the ferroelectric thin film and provide an opening therethrough for the top electrode. A ferroelectric memory cell comprises a field effect transistor together with a ferroelectric capacitor fabricated on a semiconductor substrate. In one configuration, the ferroelectric capacitor is offset from the field effect transistor, while in another configuration, the ferroelectric capacitor is substantially above the field effect transistor to provide greater density.

25 Claims, 2 Drawing Sheets

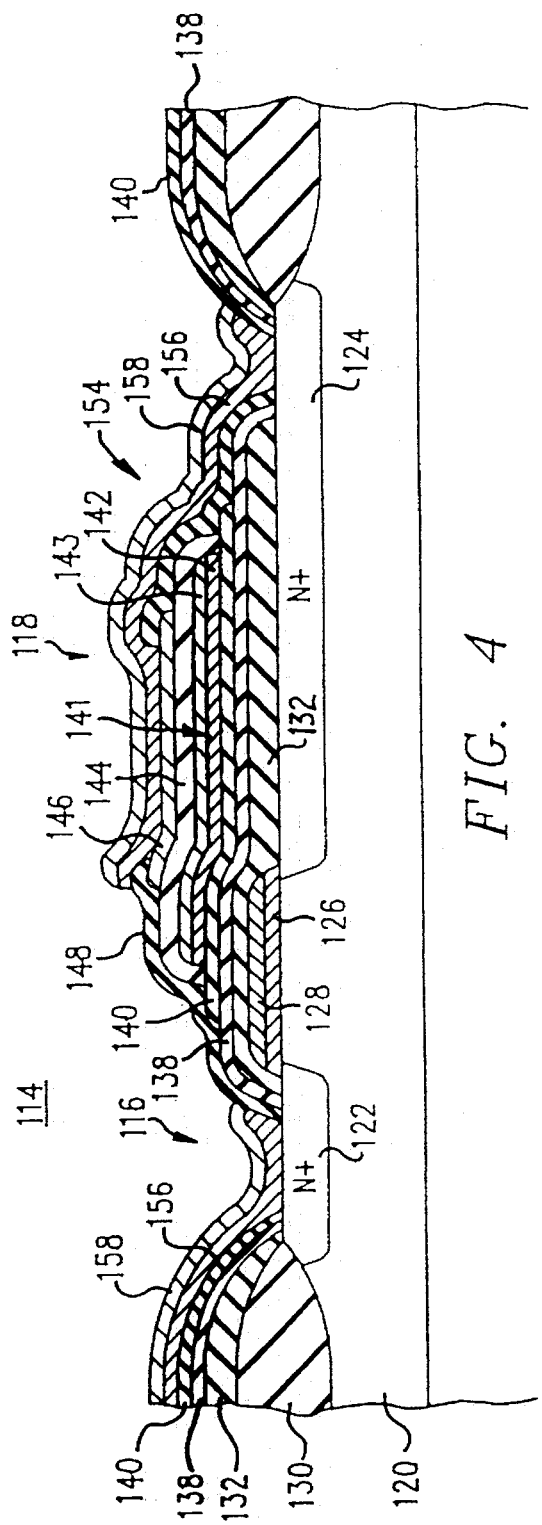
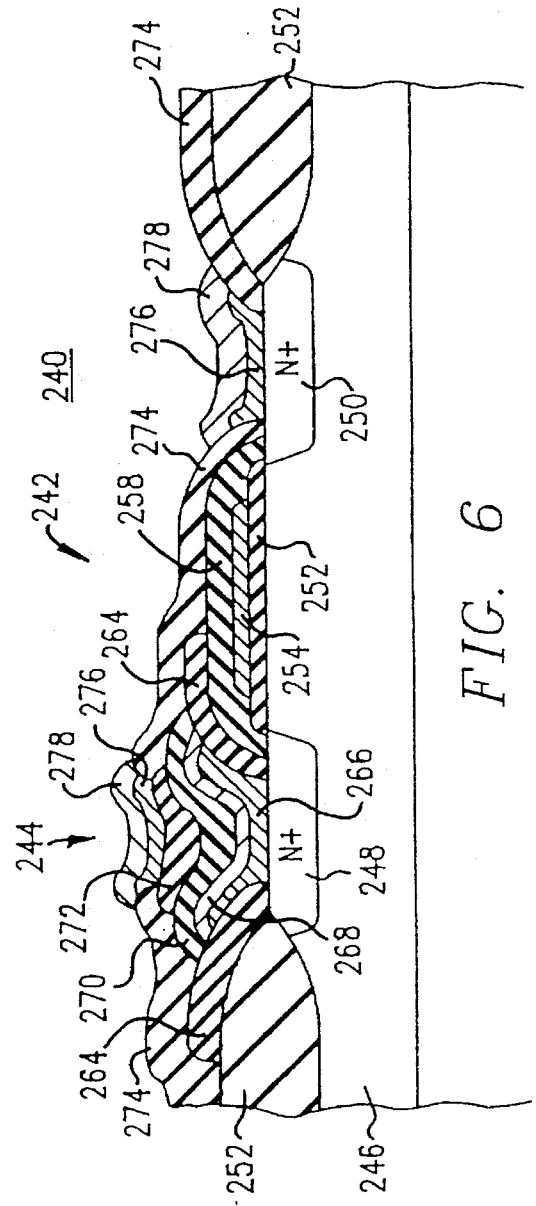
FIG. 4
FIG. 6

FABRICATION OF FERROELECTRIC CAPACITOR AND MEMORY CELL

RELATED APPLICATIONS

This is a continuation of U.S. patent application Ser. No. 07/716,061 filed Jun. 17, 1991, now abandoned, which is a divisional of U.S. patent application Ser. No. 105,578, filed Oct. 8, 1987, now U.S. Pat. No. 5,046,043.

FIELD OF THE INVENTION

The present invention pertains to integrated circuit technology and, in particular, to ferroelectric capacitors and memory storage circuits.

BACKGROUND OF THE INVENTION

Integrated circuit memories have come into widespread use in many applications, particularly in computer systems. It has been the technological trend to increase the capacity and density of such memories. As manufacturing and design techniques have improved, the cost of memory circuits has decreased dramatically, which has greatly expanded the number of applications and the size of the market. The low cost, large capacity integrated circuit memories now in use are volatile; that is, data stored in the memories is lost when the power is removed. Many applications would be improved if the memories were nonvolatile such that the data would not be lost when power is removed. In certain applications, it is mandatory that the data be retained in the memory. To fill this market, a number of nonvolatile memories have been developed. Among the most common of these now in use is the electronically programmable read only memory (EPROM). However, the nonvolatile memories now available typically have a rather low density of memory storage, are more complex to manufacture than low cost volatile memories, often have a limited lifetime, and are much more expensive than the volatile memories. The need for nonvolatile memory storage in integrated circuits was recognized early, but a low cost solution has not yet been found.

The phenomenon of ferroelectric materials has been known for many years. Such materials have multiple polarization orientation states, which can be selected by the application of an electric field. When a particular orientation state is set in a ferroelectric material, it is retained even when no power is further applied to the material. It is therefore possible to store a particular state in a nonpowered device and then read the state at a later time. Thus, it has been recognized that ferroelectric materials could serve as memory elements in an electrical circuit. An early description of this use is disclosed in U.S. Pat. No. 2,695,396 to Anderson. Since the Anderson patent, there have been more disclosures of circuitry which utilize ferroelectric elements for memory storage. Such patents include 4,144,591 to Brody, 4,149,301 to Cook and 4,360,896 to Brody. However, despite the numerous references to reports of ferroelectric memory devices, it is not known that any device of this type has been introduced into the commercial market. The demand for nonvolatile memories is well recognized and the apparent applicability of ferroelectric materials in the fabrication of such devices has been reported, but numerous problems have been experienced that have blocked the manufacture and production of any practical device. These problems include, among others, the inability to fabricate a reliable ferroelectric material for use in the field of integrated circuits, the use of ferroelectric materials which include contaminants that damage integrated circuitry, unsuitable physical configurations for ferroelectric cells, short lifetime devices, and inordinately high manufacturing costs.

The present invention includes a ferroelectric capacitor, a corresponding memory cell, and a method of manufacture which addresses and overcomes the barriers which have heretofore prevented the production of a reliable, high-density, economical, monolithic ferroelectric memory circuit.

SUMMARY OF THE INVENTION

A selected embodiment of the present invention is a ferroelectric capacitor adapted for easy fabrication with an MOS integrated circuit. On a substrate having a dielectric layer thereon, the ferroelectric capacitor includes a diffusion barrier on the surface of the dielectric layer to prevent the contamination of any part of the previously fabricated structure by the materials which form the capacitor. A bottom electrode (BEL) is formed on the surface of the barrier layer or on an interposed dielectric interface layer. A layer of ferroelectric material is next formed on the surface of the bottom electrode. Finally, a top electrode (TEL) is formed on the surface of the ferroelectric layer to complete the formation of a ferroelectric capacitor. The electrodes can include various interface layers to improve bonding and electrical contact.

A further feature of the present invention is the use of an interlayer dielectric. The dielectric layer is formed to cover a portion of the surface of the top electrode and the exposed surface of the ferroelectric layer. Interconnect metal is then provided to pass through an opening in the dielectric layer to contact the top electrode.

A further aspect of the present invention is a memory cell comprising an MOS transistor fabricated in conventional fashion on a semiconductor substrate and having a ferroelectric capacitor, as described above, fabricated as successive layers above the transistor.

A still further aspect of the present invention is a method for fabricating a nonvolatile memory cell. An integrated circuit having an array of transistors is processed up to the step of final metallization, which is not applied. A diffusion barrier layer is then applied to the surface of the wafer to protect it from contamination. The ferroelectric capacitor described above is then fabricated as described and, after deposition of the ferroelectric layer, the diffusion barrier layer is etched to leave layers at each of the sites of the memory cells.

A still further aspect of the present invention is a memory cell having filled vias above portions of a field effect transistor to produce a planar surface for receiving the ferroelectric capacitor.

A still further embodiment of the present invention is a ferroelectric memory cell comprising a field effect transistor fabricated integrally with a ferroelectric capacitor. The ferroelectric capacitor consists of bottom and top electrodes on opposite sides of a ferroelectric film wherein the electrodes and the film are superpositioned above either the source or drain region of the field effect transistor. The capacitor is connected in series with the transistor through the region underlying the capacitor. This is a compact configuration which provides for a high density memory circuit.

BRIEF DESCRIPTION OF THE DRAWINGS

For a more complete understanding of the present invention and the advantages thereof, reference is now made to the following Detailed Description taken in conjunction with the accompanying Drawings in which:

FIG. 4 is a sectional view of a ferroelectric memory cell having a ferroelectric capacitor integrally fabricated with a field effect transistor on a semiconductor substrate, FIG. 6 is a sectional view of a ferroelectric memory cell fabricated above a filled via overlying either a drain or source region of a field effect transistor.

DETAILED DESCRIPTION OF THE INVENTION

It has been proposed to use discrete ferroelectric capacitors as nonvolatile storage elements, but there has been little, if any, development work done to design a ferroelectric capacitor structure which can be easily integrated into conventional MOS production processes. It is therefore an objective of the present invention to provide a design for ferroelectric capacitors which can be easily fabricated as a part of MOS fabrication procedures.

The structures shown in the various FIGURES are not necessarily drawn to scale.

Figure 1:
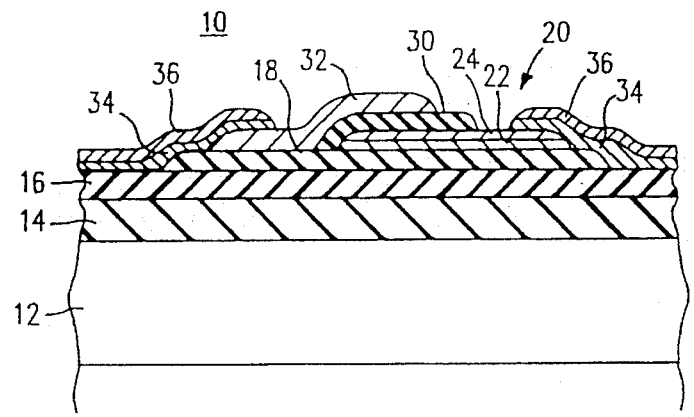
FIG. 1 is a sectional view of a ferroelectric capacitor fabricated on a semiconductor substrate and including a barrier layer.

Referring to FIG. 1, a ferroelectric capacitor 10 is shown fabricated on a conventional semiconductor substrate 12, which is typically silicon or gallium arsenide. A silicon dioxide layer 14 is deposited, grown, or otherwise produced on the surface of the silicon substrate 12. A preferred thickness for the layer 14 is 7,000 angstroms. A diffusion barrier layer 16, such as silicon nitride, is formed on the surface of the oxide layer 14 to prevent the diffusion of ferroelectric and other materials into the oxide layer 14 and the substrate 12. It is important that the added ferroelectric capacitor materials be prevented from contaminating the previously fabricated MOS structure, since such contamination could destroy the MOS circuit.

Next, a layer 18 of titanium dioxide is placed on the surface of the diffusion barrier layer 16. The layer 16 has a preferred thickness of approximately 700 angstroms and the layer 18 has a preferred thickness of approximately 1,200 angstroms.

A bottom electrode (BEL) 20 is next formed on the surface of the layer 18. The bottom electrode 20 consists of two layers. A bottom layer 22 is titanium which has a very good adherence to the titanium dioxide layer 18. An upper layer 24 is made of platinum. The platinum adheres very well to the titanium layer 22. The bottom electrode 20 has a preferred thickness of approximately 1,800 angstroms.

A layer 30 of ferroelectric material is applied on the surface of the electrode 20 extending over to a portion of the surface of the titanium dioxide layer 18. The ferroelectric layer 30 has a preferred thickness of approximately 4,000 angstroms. The production of such ferroelectric material is described in "Sol-Gel Processing of $PbTiO_3$, $PbZrO_3$, PZT, PLZT Thin Films", *Brit. Cer. Proc.*, Vol. 36, 1985, pp. 107–121 and "Preparation of Ferroelectric PZT Films by Thermodecomposition of Organometallic Compounds", *Journal of Material Science*, Vol. 19, 1984, pp. 595–598 as well as in co-pending application Ser. No. 57,323 filed Jun. 2, 1987, now U.S. Pat. No. 4,946,710, and assigned to the same assignee as the present application. A selected form of the ferroelectric layer 30 is made of a material which is termed PLZT. This is a ceramic material comprising a combination of lead, lanthanum, zirconium, and titanium. This material is further described in *Principles and Applications of Ferroelectrics*, M. E. Lines & A. M. Glass, Oxford Press 1977.

It has been found that the ferroelectric material in layer 30 bonds well to the platinum layer 24, which functions as a part of the bottom electrode.

A top electrode 32 is formed on the surface of the ferroelectric layer 30 and extends also to cover a portion of the titanium dioxide layer 18. The top electrode 32 is preferably made of platinum and has a thickness of approximately 1,500 angstroms. The platinum top electrode is utilized to form a good bond to the ferroelectric layer 30 and forms a balanced structure with the platinum layer 24 of the bottom electrode 20. By maintaining a similar contact metal for the bottom and top electrodes, it is has been found that there is a reduction in the fatigue aspect for the ferroelectric material of layer 30.

While platinum is the preferred metal for the bottom and top electrodes, other choices include palladium and alloys of either platinum or palladium.

The bottom and top electrodes of the ferroelectric capacitor 10 must be connected to circuit elements of an integrated circuit in order to function as a memory storage device. Preferably, this is done as a part of the final metallization step in the production of an integrated MOS device. However, it has been found that direct deposition of aluminum on the platinum layer 32 encounters a chemical reaction problem. Therefore, a layer 34 of titanium nitride is first deposited on the surface of the top electrode 32. An aluminum layer 36 is next formed on the surface of the layer 34. The combination of the layers 34 and 36 forms an interconnect for joining the ferroelectric capacitor 10 electrically to other elements of an MOS circuit.

The materials and procedures described above in reference to the ferroelectric capacitor 10 shown in FIG. 1 can easily be integrated with conventional MOS fabrication processes such that a ferroelectric capacitor can be built in conjunction with a standard MOS integrated circuit. The following described embodiments employ approximately the same materials and thicknesses for corresponding elements as presented for the embodiment in FIG. 1.

Figure 2:
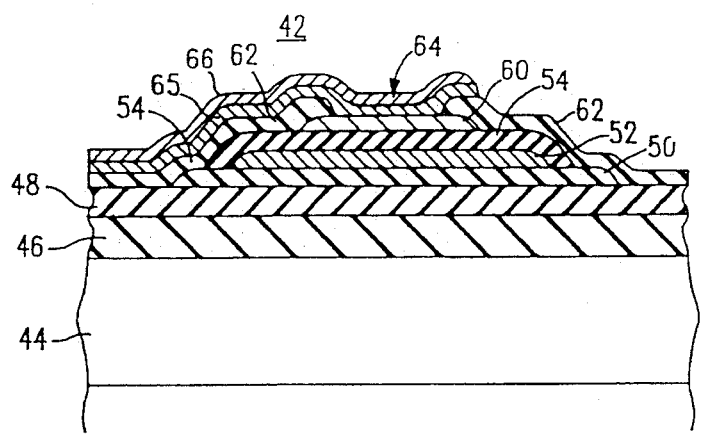
FIG. 2 is a sectional view of a ferroelectric capacitor fabricated on a semiconductor substrate and including an interlayer dielectric.

A further ferroelectric capacitor 42 is shown in FIG. 2. This capacitor likewise can be fabricated in conjunction with standard MOS processes. The capacitor 42 is fabricated on a semiconductor substrate 44. An oxide layer 46 is formed on the surface of the substrate 44. A barrier layer 48 of silicon nitride is formed on the surface of the oxide layer 46. A titanium dioxide isolation layer 50 is then formed on the surface of the layer 48. Layer 50 is etched to have a desired shape as shown. A bottom electrode 52 is formed on the surface of the layer 50 and is similar to electrode 20 shown in FIG. 1. Preferably, the bottom electrode 52 comprises two layers, a lower layer of titanium and an upper layer of platinum. Next, a layer 54 of ferroelectric material is deposited over the bottom electrode 52 and extends over the edge of electrode 52 on both sides down to the titanium dioxide layer 50.

The layer 50 isolates the ferroelectric layer 54 from the silicon nitride barrier layer 48. It has been found that when PLZT ferroelectric material is formed as a film in contact with silicon nitride, the film has a tendency to crack, but when the isolation layer 50 is included, cracking of the ferroelectric film is substantially eliminated.

On the surface of the ferroelectric layer 54 there is formed a top electrode 60 which is similar to electrode 32 shown in FIG. 1. The capacitor 42 includes an interlayer dielectric (ILD) 62 which is formed on the surface of the structure but is opened above the top electrode 60. Layer 62 is preferably made of SiO$_2$ and has a thickness of 5,000 angstroms.

Referring back to FIG. 1, it can be seen that the top electrode 32 extends in a curve over the left edge of the ferroelectric layer 30. This curvature creates a high field gradient which can increase the probability of breakdown over a period of time for the ferroelectric material. Referring to capacitor 42 of FIG. 2, the interlayer dielectric 62 resolves this problem by eliminating the curvature of the top electrode 60 around the edge of the ferroelectric layer 54. The dielectric layer 62 further provides a barrier between an interconnect layer 64 and the ferroelectric layer 54 to prevent these materials from reacting with each other during annealing steps in the semiconductor process. Interconnect layer 64 preferably comprises a lower layer 65 of titanium nitride and an upper layer 66 of aluminum. The interlayer dielectric 62 also protects the ferroelectric layer 54 during etching of the interconnect metal layer 64. In addition, the interlayer dielectric 62 permits the interconnect metal layer 64 to extend over the capacitor 42 and ferroelectric layer 54 in any manner at different places in the memory array without contacting the ferroelectric layer 54. This makes the fabrication of interconnect metal lines much easier. The dielectric 62 further acts as an etch stop for the layer 64, thereby permitting dry etching of the aluminum in layer 64.

Figure 3:
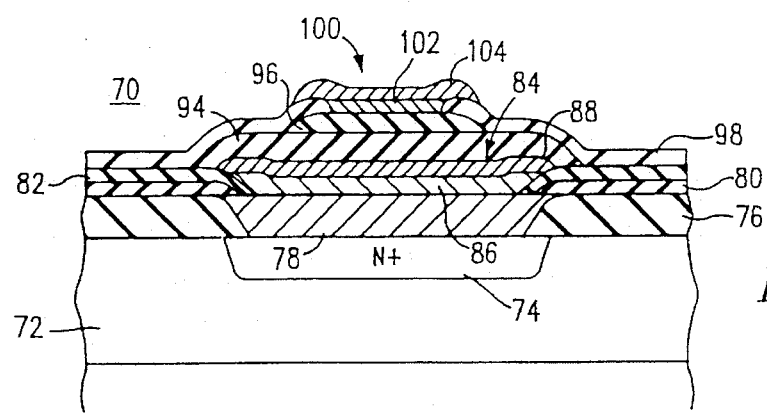
FIG. 3 is a sectional view of a ferroelectric capacitor fabricated over a filled via on a semiconductor substrate.

Referring to FIG. 3, there is shown a further ferroelectric capacitor 70 which is fabricated over a filled via on a semiconductor substrate.

The ferroelectric capacitor 70 is formed on a silicon substrate 72 and includes an N+ conductor region 74. A silicon dioxide layer 76 functions as a dielectric and is formed on the surface of the substrate 72. The portion of the layer 76 above the conductor region 74 is opened and filled to form a region 78 comprising a refractory metal such as titanium tungsten. The surface of the region 78 is planarized to be parallel with the surface of the oxide layer 76. This forms a planar surface for the formation of a ferroelectric capacitor. A diffusion barrier layer 80, made of silicon nitride, is next formed on the surface of the dielectric layer 76 and region 78. Layer 80 has an opening above the conductive region 74.

Next, there is fabricated a layer 82 of titanium dioxide over the surface of the barrier layer 80. Both of the layers 80 and 82 are open above the region 74. A bottom electrode 84 comprises two layers 86 and 88. Layer 86 is titanium and layer 88 is platinum. The titanium bonds well to the filled region 78, while the platinum layer 88 bonds well to the titanium layer 86. The bottom electrode 84 is in electrical contact with the region 74.

A ferroelectric layer 94 is formed on the surface of the bottom electrode 84 using preferably a PLZT ceramic composition. The layer 94 extends over both lateral edges of the bottom electrode 84 and contacts the titanium dioxide layer 82.

On the surface of the ferroelectric layer 94 there is formed a top electrode 96, which is preferably made of platinum. As noted above, the use of similar metals, namely platinum, as the electrodes in contact with the ferroelectric layer 94 enhances the lifetime of the ferroelectric capacitor 70. Note that the top electrode 96 covers only a portion of the surface of the ferroelectric layer 94.

An interlayer dielectric 98 is formed to cover a portion of the top electrode 96, the remaining exposed portions of the ferroelectric layer 94 and extending further to cover the titanium dioxide layer 82. The dielectric 98 is open above the top electrode 96 to permit connection of metallic lines to other circuit elements of the integrated circuit. Interconnect metal 100 comprises two layers 102 and 104. Layer 102 is preferably titanium nitride, while layer 104 is preferably aluminum. The titanium nitride layer 102 functions as an interface layer between the platinum layer 96 and the aluminum layer 104.

Referring now the FIG. 4 there is shown a ferroelectric memory cell 114. This cell consists of a field effect transistor 116 and a ferroelectric capacitor 118. The memory cell 114 is fabricated on a semiconductor substrate 120.

A further aspect of the present invention is the method of fabricating a ferroelectric memory integrated circuit. In this method the MOS transistors and related circuit components are first fabricated on the substrate 120 and the device is carried through the various fabrication stages up to the final metallization. However, the final interconnect metallization is not applied. At this point the partially completed integrated circuit will typically be shipped to a second location for addition of the ferroelectric memory capacitors and the final metallization.

The basic integrated circuit field effect transistor 116 has source and drain regions 122 and 124. A gate oxide 126, typically silicon dioxide, is formed as a layer on the surface of the substrate 120 between the regions 122 and 124. A gate 128, preferably polysilicon, is formed on the surface of the gate oxide 126.

The site of the transistor 116 is surrounded by a layer of field oxide 130 which is grown in the surface of the substrate 120 and extends to above the planar surface of the substrate 120.

A further layer 132 of silicon dioxide is grown over the surface of the substrate 120 after the gate 128 has been fabricated. The oxide layer 130 is etched such that contact openings are made to the regions 122 and 124. Next, there is applied to the surface of the wafer a silicon nitride layer 138 which functions as a diffusion barrier to prevent any of the ferroelectric capacitor materials from contaminating and thereby destroying previously fabricated elements of the integrated circuit. It is at this state of fabrication that the partially completed integrated circuit wafer can be shipped to a second location for fabrication of the ferroelectric capacitor 118.

On the partially completed integrated circuit, there is formed a layer 140 of titanium oxide on the surface of the silicon nitride layer 138. The next fabrication step comprises the placement of a bottom electrode 141 on the surface of the layer 140 at the site for the ferroelectric capacitor 118. The bottom electrode 141 comprises a lower layer 142 of titanium and an upper layer 143 which is preferably platinum. Next, a layer 144 of ferroelectric material is applied as a thin film on the surface of the bottom electrode 141 and extending over the edges of the bottom electrode 141. Next, a top electrode 146 is formed to cover a portion of the surface of the ferroelectric layer 144. The top electrode 146 is also preferably platinum.

Note that the titanium oxide layer 140 prevents the layer 144 of PLZT ferroelectric material from contacting the layer 138 of silicon nitride. It has been found that if the ferroelectric material is fabricated in contact with the layer 138 of silicon nitride that the ferroelectric film forms with cracks. These cracks in the ferroelectric film admit etchant which damages the ferroelectric film over the bottom electrode 141. But, the ferroelectric film does not crack when it is fabricated on titanium oxide.

An interlayer dielectric 148 is next formed on the elements of the ferroelectric capacitor comprising a portion of the top electrode 146, the remaining exposed portions of the ferroelectric layer 144 and the remaining exposed portions of the layers 140 and 138. Dielectric 148 is preferably silicon dioxide. The interlayer dielectric 148 extends down to the regions 122 and 124. There is an opening provided in the interlayer dielectric 148 to expose a portion of the surface of the top electrode 146.

The silicon nitride layer 138 is etched to form its desired configuration, such as over the field effect transistor 116 and the ferroelectric capacitor 118, as well as over the field oxide 130. The etching of the layer 138 is performed at any time after the ferroelectric layer 144 has been applied. The ferroelectric material within the layer 144 can be a serious contaminant for the remainder of the MOS circuit components. It is therefore important that the barrier diffusion layer 138 be in place during the fabrication of the ferroelectric layer 144.

The final interconnect metal is next applied to provide the interconnections between the field effect transistor 116 and the ferroelectric capacitor 118 with the remainder of the circuit components within the overall integrated circuit. The interconnect metal 154 consists of two layers 156 and 158. Layer 156 is preferably titanium nitride and layer 158 is preferably aluminum. In most situations, a final passivation layer will be applied, as in the usual practice, to cover the entire exposed surface of the ferroelectric memory cell 114.

Figure 5:
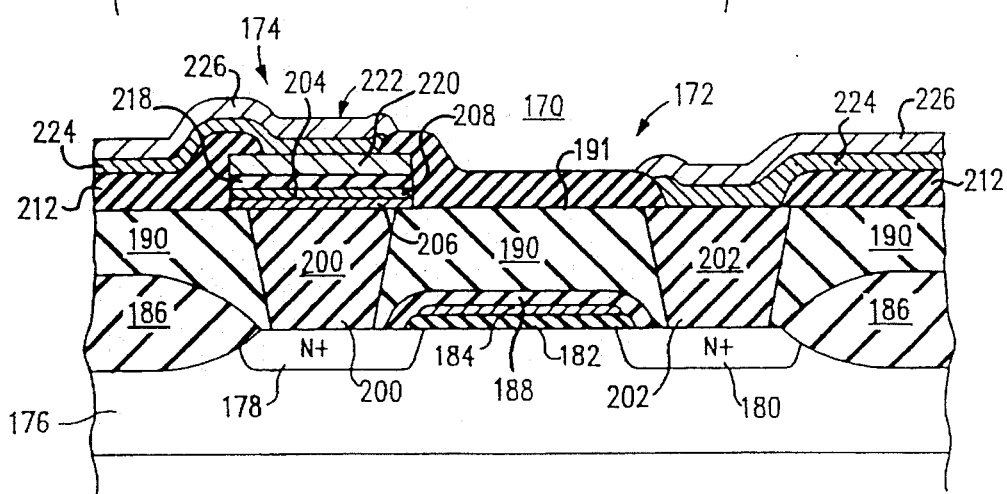
FIG. 5 is a sectional view of a ferroelectric memory cell comprising a ferroelectric capacitor fabricated above filled vias of a field effect transistor on a semiconductor substrate.

Referring now to FIG. 5 there is shown a further embodiment of the present invention. This comprises a ferroelectric memory cell 170 which includes a field effect transistor 172 and a ferroelectric capacitor 174. The memory cell 170 is preferably fabricated in two separate operations with all of the MOS processing performed first and the ferroelectric capacitor 174 added in a second series of processing operations. A significant feature of the present invention is that the materials and processes used in fabricating the ferroelectric capacitor 174 are compatible with the materials and processes used in fabricating the original MOS structures, including the transistor 172.

As with the other devices disclosed herein, the ferroelectric memory cell 170 is fabricated on a semiconductor substrate 176. The field effect transistor 172 includes source and drain regions 178 and 180, a gate oxide 182 and a gate 184. The gate 184 is preferably polysilicon. The site of the transistor 172 is surrounded by a field oxide layer 186. The gate 184 is covered with a layer 188 comprising silicon dioxide.

Following completion of the fabrication for the field effect transistor 172, there is applied over the entire device a layer of 190 P-glass (phosphorous glass). This layer is etched to open areas above the source and drain regions 178 and 180. These open areas are filled with a conductive metal to form conductive regions (filled vias) 200 and 202. The preferable material for use in these vias is titanium tungsten. The upper surface of the layer 190 and the filled regions 200 and 202 are planarized to produce a single planar surface 191 across the device.

Next, a bottom electrode 204 is applied to the planarized surface 191. The bottom electrode 204 comprises a lower layer 206 which is preferably a barrier material, such as titanium and a layer 208 which is preferably platinum, palladium or gold. These layers initially cover the entire device. A layer 218 of ferroelectric material is next formed on the surface of the bottom electrode 204. A top electrode 220 is formed as a layer on the surface of the ferroelectric 218. The top electrode is either platinum, palladium or gold and is the same as the selected material for the bottom electrode layer 208.

A stack etch process is next carried out with conventional masking and etching processes such as reactive ion etching or ion milling to form the individual ferroelectric capacitors 174 over each of the selected filled via regions, such as 200. The stack etch simultaneously etches the bottom electrode 204, the ferroelectric layer 218 and the top electrode 220.

Next, an interlayer dielectric 212, which is preferably silicon oxide, is formed over the exposed surface of the device. The layer 212 is etched to provide openings over the regions such as 202 and openings above the top electrode 220. An interconnect metal 222 is applied which comprises a titanium nitride layer 224 and an aluminum layer 226. The interconnect metal 222 is appropriately etched to provide the desired interconnection between the circuit elements.

The stack etch process requires only two masks for producing the ferroelectric capacitor structure, one mask for the stack etch and another for interlayer dielectric layer 212.

The resulting memory cell 170 shown in FIG. 5 is an integral combination of the field effect transistor 174 and the ferroelectric capacitor 172. An array of such cells can be utilized to form a non-volatile memory circuit.

A still further embodiment of the present invention is illustrated in FIG. 6. A ferroelectric memory cell 240 consists of a field effect transistor 242 and a ferroelectric capacitor 244. The cell 240 is fabricated on a substrate 246. Source and drain regions 248 and 250 are formed in the substrate 246. The site of the transistor 242 is surrounded by a field oxide 252 which is deposited or grown in the surface of the substrate 246. A gate oxide 252, typically silicon dioxide, is formed on the surface of the substrate 246 between the regions 248 and 250. Above the oxide 252 there is formed a gate 254, which is preferably polysilicon. A diffusion barrier layer 258 comprising silicon nitride is applied across the entire surface of the integrated circuit chip and then etched to provide openings above the regions 248 and 250. As with the diffusion barrier layers described above, this layer prevents contamination of the MOS components below it by the ferroelectric materials which are fabricated above it.

At this stage of the processing, the MOS transistors have been fabricated in place and the chip processing can continue to add the ferroelectric capacitor. This processing can take place at the same location or the chip can be shipped to another location for fabrication of the capacitor element and final metallization.

In the next step a layer 264 of titanium oxide is deposited on the surface and etched to provide a opening over the region 248 while extending over portions of the field oxide 252 and the layer 258. Next a layer 266 of titanium or titanium nitride is deposited over the region 248 and extends to cover adjacent portions of the layer 264. The layer 266 forms an electrical contact to the region 248.

Next, a layer 268 of platinum is applied above the layer 266. A ferroelectric layer 270 is formed as a film over the platinum layer 268 which functions as a bottom electrode. A layer 272 of platinum is deposited over the center portion of the ferroelectric layer 270. Note that the top and bottom electrodes are the same metal.

In the next step, an interlayer dielectric 274, preferably silicon dioxide, is deposited over the surface of the integrated circuit and opened above the top electrode layer 272 and above the region 250.

A layer 276 of titanium nitride is deposited on a surface of the platinum layer 272 in the opening provided through the dielectric 274. The layer 276 is also deposited over the region 250.

The final metallization is completed by a layer 278 of aluminum.

The memory cell 240 is a compact arrangement with the combination of a field effect transistor and a ferroelectric capacitor. The entire cell occupies approximately the same area required for a single field effect transistor.

In an alternate embodiment, the region 248 can be a conductive path formed by doping the substrate 246. The resulting capacitor overlies and is connected to the region (path) 248.

In summary, the present invention comprises a unique ferroelectric capacitor which can easily be implemented with conventional MOS manufacturing processes, a ferroelectric memory cell for use in integrated circuits and methods for manufacturing the capacitors and cells.

Although several embodiments of the invention have ben illustrated in the accompanying drawings and described in the foregoing detailed description, it will be understood that the invention is not limited to the embodiments disclosed, but is capable of numerous rearrangements, modifications and substitutions without departing from the scope of the invention.

What we claim is:

1. A method for fabricating a nonvolatile ferroelectric capacitor, comprising the steps of:

forming an insulating layer on a planar surface of a semiconductor body;

forming a titanium dioxide interface layer on a planar surface of said insulating layer, said titanium dioxide interface layer bonding to said insulating layer;

forming a first metal layer on the surface of said titanium dioxide interface layer, the first metal selected from the group consisting of platinum, palladium, and alloys of platinum or palladium, said first metal layer bonding to said titanium dioxide interface layer;

applying a PLZT type of ferroelectric dielectric material to the surface of said first metal layer and converting said ferroelectric dielectric material to a ceramic material; and forming a second metal layer on the surface of said ferroelectric dielectric material, the metal of said second metal layer selected from the group consisting of platinum, palladium, and alloys of platinum or palladium, wherein said first and second metal layers and said ferroelectric dielectric material comprise a ferroelectric capacitor.

2. The method of claim 1, further including first fabricating a semiconductor substrate with an array of MOS transistors therein, and thereafter forming an array of said ferroelectric capacitors on the substrate and connecting a plate of each said ferroelectric capacitor to a respective transistor such that an array of memory cells are defined, each memory cell having a transistor and a ferroelectric capacitor.

3. A method of integrating a ferroelectric capacitor with a transistor to form a memory cell, comprising the steps of:

forming in a semiconductor material a switching MOS transistor as a component of the memory cell, including forming doped regions in the semiconductor material to function as a source region and as a drain region, and forming a gate structure to control conduction between the source region and the drain region;

forming a layer of insulating material over said MOS transistor;

forming a respective via in said layer of insulating material to said drain region and to said source region;

filling each said via with a plug of a conductive metal, said plugs defining a first metallization;

forming a ferroelectric capacitor on one said conductive plug, said ferroelectric capacitor having a bottom capacitor electrode in electrical contact with said one conductive plug, said bottom capacitor electrode being constructed of a material different from said one conductive plug;

forming a dielectric of a ferroelectric material on said bottom capacitor electrode;

forming a top capacitor electrode on said ferroelectric material; and etching said ferroelectric material to form said ferroelectric capacitor about the same size as a top surface of said one conductive plug, whereby the memory cell is achieved.

4. The method of claim 3, further including forming said bottom capacitor electrode with a first layer of a titanium-based material and a second layer of platinum.

5. The method of claim 3, further including forming said conductive plugs with titanium tungsten.

6. The method of claim 3, further including forming said bottom capacitor electrode with a first layer of titanium nitride and a second layer of platinum.

7. The method of claim 3, further including planarizing a top surface of said one conductive plug to be planar with a top surface of said insulating material to define a flat surface, and forming the ferroelectric capacitor thereon such that said top and bottom capacitor electrodes and said ferroelectric material is characterized by a topography that is planar.

8. The method of claim 7, further including planarizing a top surface of the other said conductive plug of said memory cell and connecting an interconnect metallization between said other planarized conductive plug and circuits of an integrated circuit.

9. A method of fabricating a nonvolatile ferroelectric memory, comprising the steps of:

fabricating an array of MOS transistors in a semiconductor substrate, and fabricating other memory support circuits in the semiconductor substrate, said semiconductor substrate defining a completed transistor substrate;

forming an array of ferroelectric capacitors over the semiconductor substrate and connecting each ferroelectric capacitor to a respective transistor of the array to form an array of nonvolatile memory cells, each cell having at least one ferroelectric capacitor connected to at least one transistor, by carrying out the following steps, forming an electrical isolation over the surface of the semiconductor substrate;

forming a barrier layer with a conductive material over the isolation layer to protect the completed transistor substrate from a ferroelectric capacitor fabrication process;

carrying out said ferroelectric capacitor fabrication process by forming a bottom capacitor plate electrode, wherein said conductive material of the barrier layer is formed as part of each said bottom capacitor plate electrode, forming a top capacitor plate electrode and a ferroelectric material therebetween in association with each said MOS transistor; and connecting one plate electrode of each said ferroelectric capacitor to a respective said MOS transistor so that the array of transistor-capacitor nonvolatile memory cells is formed, said connecting step being carried out by forming a via in said isolation overlying the surface of said semiconductor substrate to expose a semiconductor region of each said MOS transistor, and filling each said via with a conductive plug so that a top surface of the conductive plug is in electrical contact with said conductive barrier material, thereby providing a vertical contact between the ferroelectric capacitor and the MOS transistor; and forming interconnect metal conductors to the support circuits of the semiconductor substrate after processing of the ferroelectric material.

10. The method of claim 9, further including fabricating the top and bottom capacitor plate electrodes of the ferroelectric capacitor before any interconnect metallization layers have been formed for connection to the support circuits of the semiconductor substrate.

11. The method of claim 9, further including forming portions of the top and bottom capacitor plate electrodes that are in physical contact with the respective top and bottom surfaces of the ferroelectric material with the same conductive material.

12. The method of claim 9, further including forming an aluminum interconnect layer in electrical contact with said top capacitor plate electrode via a conductive barrier layer that prevents interaction between aluminum and the ferroelectric material.

13. A method of fabricating a nonvolatile ferroelectric memory, comprising the steps of:

fabricating an array of transistors in a semiconductor substrate without initially forming a metallization layer thereover to interconnect the transistors of the memory together;

depositing an insulating layer on said semiconductor substrate;

forming vias in said insulating layer to expose respective regions of each said transistor;

filling the vias with a conductive plug of a refractory metal;

covering the insulating layer and the filled vias with a conductive layer of a barrier material to prevent degradation of the semiconductor substrate during processing of ferroelectric capacitor structures;

forming a ferroelectric dielectric having a top surface in electrical contact with a top plate of each capacitor, and a bottom surface in electrical contact through said conductive barrier material with a respective transistor region by way of one said conductive plug; and removing by etching peripheral areas of said conductive barrier material laterally surrounding each said ferroelectric capacitor after formation of said ferroelectric capacitor, whereby said semiconductor substrate is protected by said conductive barrier during fabrication of said ferroelectric capacitor structures.

14. The method of claim 13, wherein said conductive barrier material comprises a titanium based material.

15. A method of fabricating a nonvolatile ferroelectric memory, comprising the steps of:

fabricating an array of MOS-type transistors in a semiconductor substrate, each memory cell of the memory array having at least one transistor and at least one ferroelectric capacitor;

forming an electrical insulation overlying said semiconductor substrate and forming an opening therein to a semiconductor region of each said transistor;

depositing a first metal in the openings of the electrical insulation in electrical contact with each said semiconductor region;

forming a layer of a conductive barrier material over the substrate so as to be electrically connected to each said semiconductor region via the first metal, said conductive barrier material functioning to provide a barrier between a ferroelectric material of the ferroelectric capacitors and the semiconductor transistor regions during processing of the ferroelectric material;

forming a bottom capacitor electrode overlying and in electrical contact with the conductive barrier so that each conductive bottom electrode is electrically connected to a respective said semiconductor transistor region;

forming a ferroelectric dielectric material overlying said bottom capacitor electrode, said conductive barrier preventing contamination of the semiconductor substrate during processing of the ferroelectric dielectric material;

patterning and etching the ferroelectric dielectric material; and forming a top capacitor electrode overlying the ferroelectric dielectric material, whereby a nonvolatile memory cell is defined having a ferroelectric capacitor formed in series with a transistor.

16. The method of claim 15, further including depositing a titanium-based material as the conductive barrier.

17. The method of claim 15, further including forming said first metal with a refractory metal.

18. A method for fabricating a nonvolatile ferroelectric memory, comprising the steps of:

fabricating a completed integrated memory circuit in a semiconductor substrate, said integrated memory circuit including an array of transistors in which each transistor is associated with a memory cell;

passivating the semiconductor substrate with a layer of electrically insulating material;

fabricating an array of ferroelectric capacitors on the passivated semiconductor substrate, each said ferroelectric capacitor having a top and bottom conductive electrode separated by a ferroelectric dielectric;

the ferroelectric capacitor fabricating step being carried out by a) forming an opening in the passivating layer to a semiconductor region of each said transistor of the array, b) forming a conductive metal plug in each said opening of the passivating insulating material to provide electrical connections to a semiconductor region of each said transistor, c) forming the bottom capacitor electrode overlying each conductive metal plug and with a plate area substantially no larger than a top surface of the conductive plug, d) forming the ferroelectric dielectric on the bottom capacitor electrode, and e) forming the top capacitor electrode on the ferroelectric dielectric.

19. The method of claim 18, further including forming a conductive barrier between the ferroelectric capacitor and the conductive plug to prevent contamination of the semiconductor substrate during fabrication of the ferroelectric capacitor while yet allowing electrical activity therebetween.

20. The method of claim 18, further including stack etching said top capacitor electrode, said ferroelectric dielectric, and said bottom capacitor electrode so that a plate area of the ferroelectric capacitor is substantially the same size as the top surface of the conductive plug.

21. The method of claim 18, wherein a top surface of the passivating insulating material is planar, and further including forming the metal plug having a top surface planar with a top surface of the insulating material so that the ferroelectric capacitor formed thereon has a planar layer of ferroelectric dielectric.

22. The method of claim 18, further including forming the conductive plug in electrical contact with one of a transistor drain or source region, and forming another opening in the insulating material and a second conductive metal plug in electrical contact with the other of the transistor drain or source region, said conductive plug defining a first metal level, and further including forming a second metal interconnect level in electrical contact with the top capacitor electrode of the ferroelectric capacitor and in contact with the second conductive plug, and patterning the second metal interconnect level to define individual conductors.

23. The method of claim 18, further including fabricating the ferroelectric capacitors on the semiconductor substrate before an interconnect metallization layer has been formed on the semiconductor substrate to connect memory cells together.

24. The method of claim 18, further including forming an individual ferroelectric capacitor associated with each said transistor.

25. A method of fabricating a nonvolatile ferroelectric memory, comprising the steps of:

fabricating an array of MOS-type transistors in a semiconductor substrate, each memory cell of the memory array having at least one transistor and at least one ferroelectric capacitor;

forming an electrical insulation overlying said semiconductor substrate and forming an opening therein to a semiconductor region of each said transistor;

forming a layer of a conductive barrier material over the substrate so as to be electrically connected to each said semiconductor region, said conductive barrier material functioning to provide a barrier between ferroelectric material of the ferroelectric capacitors and the semiconductor transistor regions during processing of the ferroelectric material;

forming a conductive bottom electrode overlying and in electrical contact with the conductive barrier so that the conductive bottom electrode is electrically connected to each said semiconductor transistor region;

forming a ferroelectric dielectric material overlying said conductive bottom electrode, said conductive barrier preventing contamination of the semiconductor substrate during processing of the ferroelectric material;

forming a top conductive electrode overlying the ferroelectric material, whereby a memory cell is defined having a ferroelectric capacitor formed in series with a transistor;

stack etching the top electrode and the ferroelectric dielectric; and etching the bottom electrode conductive barrier material after etching the ferroelectric material so that the ferroelectric capacitor is no larger than the underlying semiconductor region, as measured in a direction of a conduction channel between a transistor drain region and a transistor source region.

* * * * *